United States Patent
Lee et al.

(10) Patent No.: US 8,257,984 B2
(45) Date of Patent: Sep. 4, 2012

(54) FERROELECTRIC CAPACITOR AND METHOD OF MANUFACTURING THE SAME

(75) Inventors: June-key Lee, Suwon (KR); Young-soo Park, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/319,555

(22) Filed: Dec. 29, 2005

(65) Prior Publication Data
US 2006/0102944 A1    May 18, 2006

Related U.S. Application Data

(62) Division of application No. 10/270,521, filed on Oct. 16, 2002, now Pat. No. 7,002,193.

(30) Foreign Application Priority Data

Nov. 10, 2001 (KR) ................................ 2001-69986
Sep. 27, 2002 (KR) ................................ 2002-58765

(51) Int. Cl.
*H01L 29/72* (2006.01)
(52) U.S. Cl. ............ 438/3; 438/239; 438/240; 438/250; 257/E21.208; 257/E27.104
(58) Field of Classification Search .................. 438/255, 438/3, 240, 239, 250; 257/308, 311, E21.208, 257/E27.104
See application file for complete search history.

(56) References Cited

U.S. PATENT DOCUMENTS

| 5,119,154 A * | 6/1992 | Gnadinger .................... 257/295 |
| 5,382,817 A | 1/1995 | Kashihara et al. |
| 6,001,660 A | 12/1999 | Park et al. |
| 6,144,060 A | 11/2000 | Park et al. |
| 6,232,174 B1 | 5/2001 | Nagata et al. |

(Continued)

FOREIGN PATENT DOCUMENTS

JP    05-299601    11/1993

(Continued)

OTHER PUBLICATIONS

Wolf et al., "Silicon Processing for the VLSI Era vol. 1: Process Technology", 1986, Lattice Press, p. 191-194.*

*Primary Examiner* — Kenneth Parker
*Assistant Examiner* — Jose R Diaz
(74) *Attorney, Agent, or Firm* — Harness, Dickey & Pierce, P.L.C.

(57) ABSTRACT

A ferroelectric capacitor and a method of manufacturing the same are provided, wherein the ferroelectric capacitor of a semiconductor device, which sequentially includes a lower electrode, a ferroelectric layer, and an upper electrode on a conductive layer connected to a transistor formed on a semiconductor substrate, includes an oxidation preventing layer between the conductive layer and the lower electrode. The oxidation preventing layer prevents the conductive layer from being oxidized during high-temperature heat treatment of the ferroelectric layer. Accordingly, the oxidation resistivity of the interfaces of the conductive layer, used as a storage node, and the lower electrode, which faces the conductive layer, increases, so a temperature at which a ferroelectric thin layer is formed can be also increased. Consequently, a ferroelectric thin layer having excellent characteristics may be obtained.

13 Claims, 6 Drawing Sheets

U.S. PATENT DOCUMENTS

| | | |
|---|---|---|
| 6,281,537 B1 | 8/2001 | Kim |
| 6,303,952 B1 | 10/2001 | Aoki et al. |
| 6,407,422 B1 * | 6/2002 | Asano et al. ............... 257/306 |
| 6,465,300 B2 * | 10/2002 | Kim et al. ............... 438/253 |
| 6,509,601 B1 | 1/2003 | Lee et al. |
| 6,737,694 B2 * | 5/2004 | Kim et al. ............... 257/296 |
| 6,753,564 B2 * | 6/2004 | Oh ............... 257/296 |
| 6,818,935 B2 * | 11/2004 | Kweon et al. ............... 257/295 |
| 2001/0051381 A1 * | 12/2001 | Yang et al. ............... 438/3 |
| 2002/0014646 A1 * | 2/2002 | Tsu et al. ............... 257/296 |
| 2003/0030084 A1 | 2/2003 | Moise et al. |
| 2003/0205738 A1 | 11/2003 | Kanaya et al. |

FOREIGN PATENT DOCUMENTS

| | | |
|---|---|---|
| JP | 11-054718 | 2/1999 |
| JP | 2000-223666 | 8/2000 |
| JP | 2001-111007 | 4/2001 |
| JP | 2001-298164 | 10/2001 |
| KR | 1998-077179 A | 11/1998 |
| KR | 1999-006044 | 1/1999 |
| KR | 1999-0051335 | 7/1999 |
| KR | 2001-0011157 | 2/2001 |
| KR | 2001-0065297 | 7/2001 |

* cited by examiner

FERROELECTRIC CAPACITOR AND METHOD OF MANUFACTURING THE SAME

CROSS REFERENCE TO RELATED APPLICATION(S)

This is a divisional application based on application Ser. No. 10/270,521, filed Oct. 16, 2002 now U.S. Pat. No. 7,002,193, the entire contents of which is hereby incorporated by reference.

BACKGROUND OF THE INVENTION

1. Field of the Invention

The present invention relates to a capacitor of a semiconductor device and a method of manufacturing the same. More particularly, the present invention relates to a capacitor of a semiconductor device, which reduces contact resistance and increases oxidation resistivity of a storage node thereof, and a method of manufacturing the same.

2. Description of the Related Art

With the development of portable information and communication apparatuses, there is an increase in demand for nonvolatile memories in which stored data is not removed even if power is off. A representative electronic device satisfying this demand is a ferroelectric RAM (FRAM) device. The FRAM device is advantageous in that information is written at high speed, power consumption is small, and stored data does not volatilize.

A ferroelectric capacitor including a ferroelectric thin film and an upper electrode and a lower electrode on both sides, respectively, of the ferroelectric thin film is an essential device of the FRAM device. Such a ferroelectric capacitor is sometimes formed above a transistor provided in the FRAM device in order to increase integrity. In this case, usually a polysilicon plug is used to connect the ferroelectric capacitor to the transistor.

FIGS. 1 through 5 illustrate sectional view for explaining stages in a conventional method of manufacturing a ferroelectric capacitor.

Referring to FIG. 1, a gate 4 and a bit line 6 are formed to be separated from each other by a predetermined, sufficient distance on a substrate 2. An interlayer insulation layer 8 is formed on the substrate 2 such that the gate 4 and the bit line 6 are covered by the interlayer insulation layer 8. A contact hole 10 is formed between the gate 4 and the bit line 6 to expose a portion of the substrate 2. The contact hole 10 is filled with a silicon plug 12.

Referring to FIG. 2, a cobalt (Co) film 14 is formed on the top of the interlayer insulation layer 8 and the polysilicon plug 12. Here, a Co-silicide layer 16 is formed at the contact portion between the polysilicon plug 12 and the Co film 14. The Co-silicide layer 16 is used as an oxidation preventing layer. The oxidation preventing layer prevents the polysilicon plug 12 from being oxidized during subsequent heat treatment of a ferroelectric layer at a high temperature of 600-800° C.

As shown in FIG. 3, the Co film 14 is removed from the interlayer insulation layer 8. Thereafter, as shown in FIG. 4, a titanium (Ti) film 18 is formed on the interlayer insulation layer 8 so that the interlayer insulation layer 8 and the Co-silicide layer 16 on the silicon plug 12 are covered by the Ti film 18. The Ti film 18 is used as a bonding film. The Ti film 18 enhances the adhesive power between the interlayer insulation layer 8 having a ceramic characteristic and a lower electrode.

Referring to FIG. 5, a lower electrode 20, a ferroelectric layer 22, and an upper electrode 24 are sequentially formed on the surface of the Ti film 18, thereby forming a ferroelectric capacitor. The ferroelectric layer 22 is usually heat-treated at a high temperature to improve a thin film characteristic. During the heat treatment, the Ti film 18 may be oxidized, which results in a bad contact in which the polysilicon plug 12 becomes electrically isolated from the lower electrode 20.

SUMMARY OF THE INVENTION

In an effort to solve the above-described problems, it is a first feature of an embodiment of the present invention to provide a ferroelectric capacitor that increases the contact area between a storage node and a lower electrode and increases the oxidation resistivity.

It is a second feature of an embodiment of the present invention to provide a method of manufacturing the ferroelectric capacitor.

To provide the first feature of an embodiment of the present invention, there is provided a ferroelectric capacitor of a semiconductor device sequentially including a lower electrode, a ferroelectric layer, and an upper electrode on a conductive layer, which is connected to a transistor formed on a semiconductor substrate. The ferroelectric capacitor includes an oxidation preventing layer between the conductive layer and the lower electrode. The oxidation preventing layer prevents the conductive layer from being oxidized during high-temperature heat treatment of the ferroelectric layer.

Preferably, the oxidation preventing layer is a $CoSi_2$ layer, a TiN layer, a TiAlN layer, or a TiSiN layer.

To provide the second feature of an embodiment of the present invention, there is provided a method of manufacturing a ferroelectric capacitor. The method includes forming an interlayer insulation layer on a substrate having a transistor and a bit line so that the transistor and the bit line are covered by the interlayer insulation layer; forming a contact hole in the interlayer insulation layer to partially expose the substrate; forming a conductive layer having a predetermined thickness on the interlayer insulation layer, the conductive layer filling the contact hole; forming an oxidation preventing layer on the conductive layer; and sequentially forming a lower electrode, a ferroelectric layer, and an upper electrode on the oxidation preventing layer.

Preferably, the conductive layer is a doped polysilicon layer or a tungsten layer. Preferably, the oxidation preventing layer is a $CoSi_2$ layer, a TiN layer, a TiAlN layer, or a TiSiN layer. Also preferably, the lower electrode is made of an Ir layer, an $IrO_2$/Ir layer, or a Pt/$IrO_2$/Ir layer. Preferably, the ferroelectric layer is a PZT ($PbZr_xTi_{1-x}O_3$) layer, a SBT ($SrBi_2Ta_2O_9$) layer, or an LBT ($La_xBi_{4-x}Ti_3O_{12}$) layer.

According to the present invention, the oxidation resistivity of the interfaces of a storage node of a capacitor and a lower electrode, which face each other increases, so a temperature at which a ferroelectric thin layer is formed can be also increased. Consequently, a ferroelectric thin layer having excellent characteristics may be obtained.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
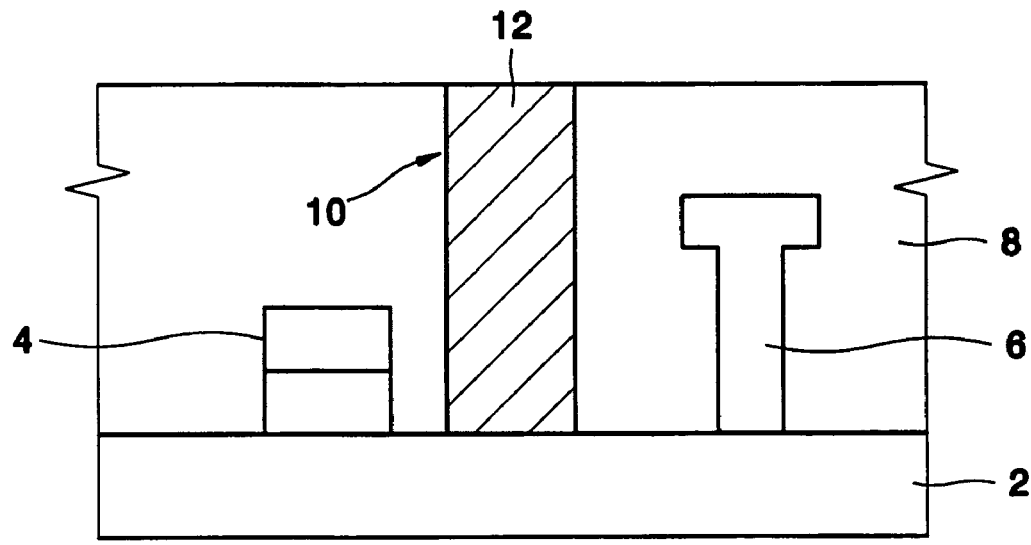
FIGS. 1 through 5 illustrate sectional views for explaining stages in a conventional method of manufacturing a ferroelectric capacitor.
Figure 2:
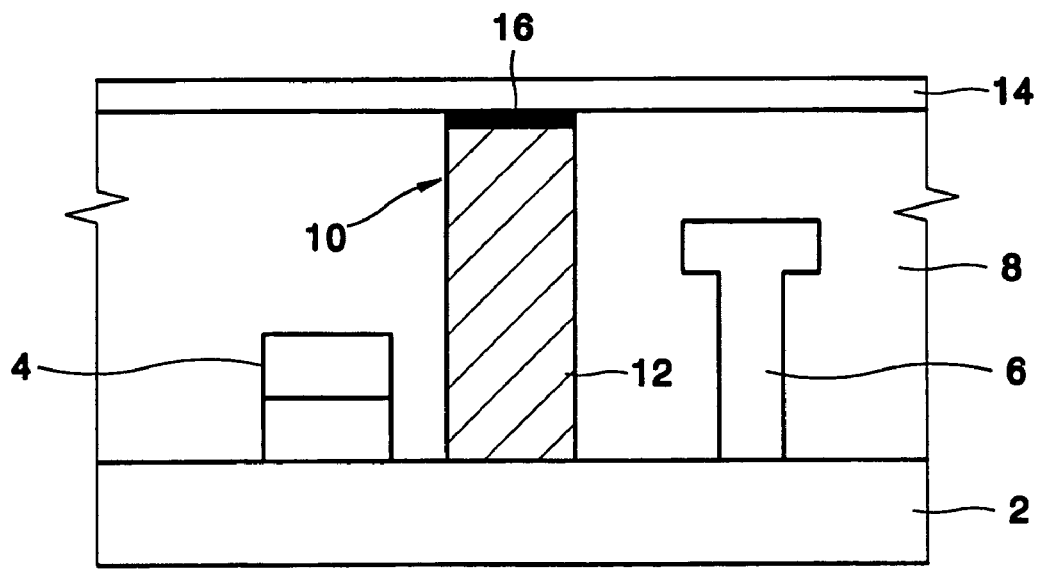
Figure 3:
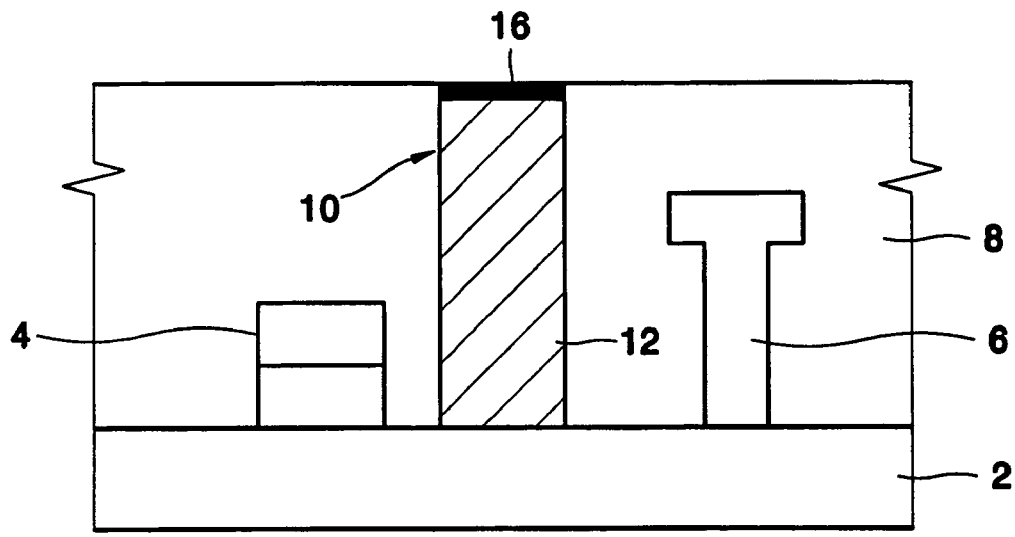
Figure 4:
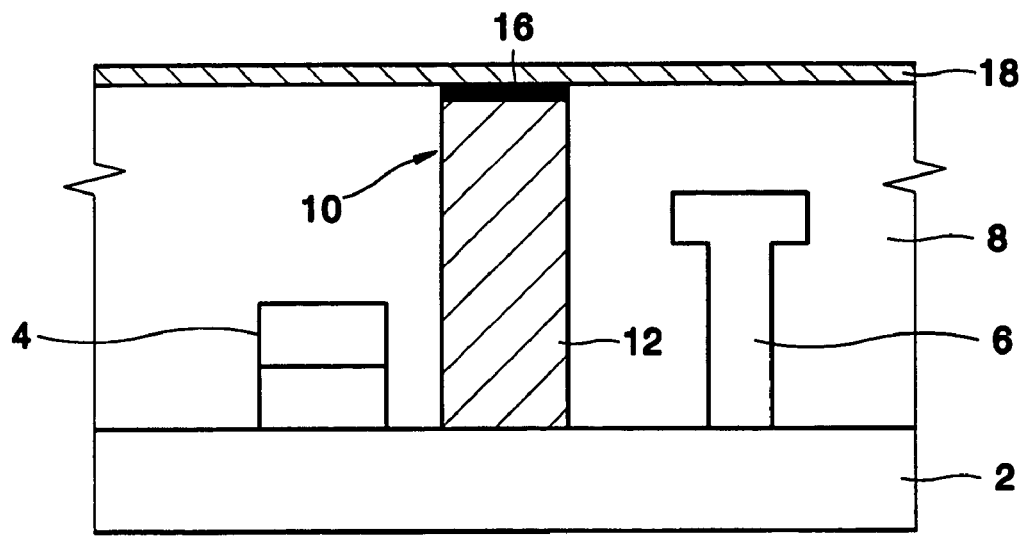
Figure 5:
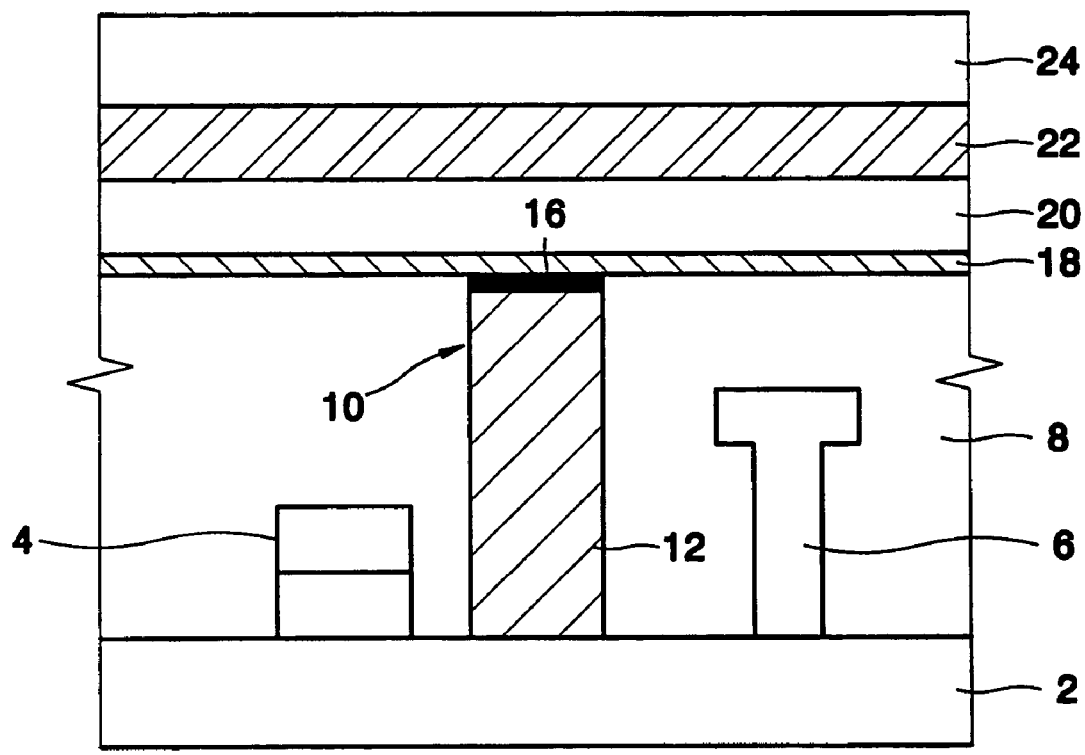

Korean Patent Application No. 2001-69986, filed on Nov. 10, 2001, and entitled: "Method of Manufacturing Ferroelectric Capacitor," and Korean Patent Application No. 2002-58765, filed on Sep. 27, 2002, and entitled: "Ferroelectric Capacitor and Method of Manufacturing the Same," are incorporated by reference herein in their entirety.

A preferred embodiment of the present invention will now be described more fully hereinafter with reference to the accompanying drawings, in which a preferred embodiment of the present invention is shown. The invention may, however, be embodied in different forms and should not be construed as limited to the embodiment set forth herein. In the drawings, the thickness of layers and regions are exaggerated for clarity. It will also be understood that when a layer is referred to as being "on" another layer or substrate, it may be directly on the other layer or substrate, or one or more intervening layers may also be present. In addition, it will also be understood that when a layer is referred to as being "between" two layers, it may be the only layer between the two layers, or one or more intervening layers may also be present. Like reference numerals refer to like elements throughout.

Figure 6:
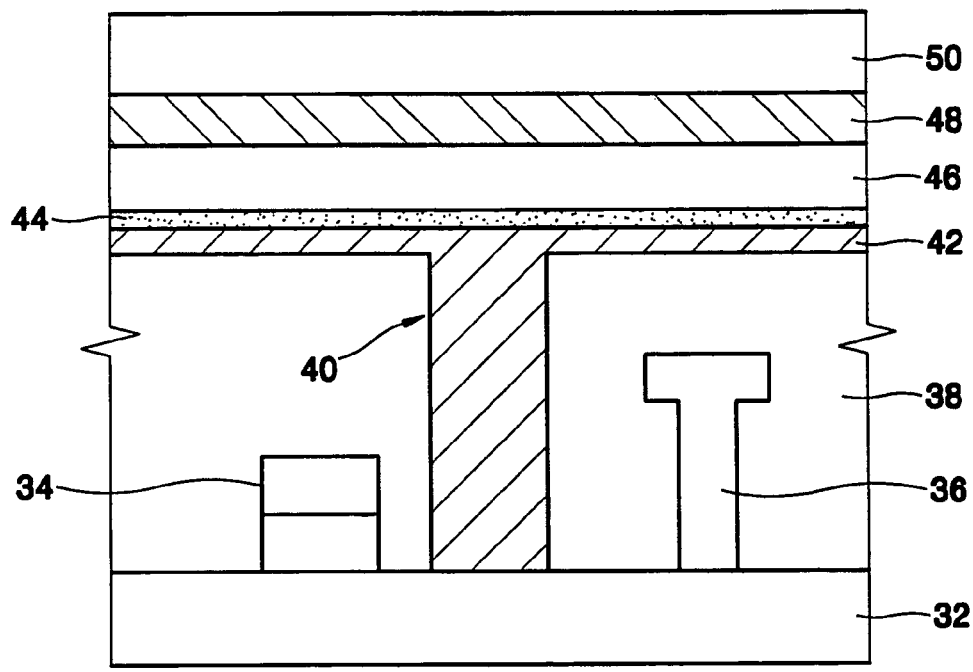
FIG. 6 illustrates a sectional view of a ferroelectric capacitor of a semiconductor device according to an embodiment of the present invention.

Referring to FIG. 6, a ferroelectric capacitor of a semiconductor device according to an embodiment of the present invention includes a gate 34 formed on a substrate 32. A bit line 36 is separated from the gate 34 by a predetermined distance. A source and a drain (not shown) are formed at opposite sides of the gate 34, thereby forming a transistor on the substrate 32.

The gate 34 and the bit line 36 are covered by an interlayer insulation layer 38, which is formed on the substrate 32. The interlayer insulation layer 38 has a flat surface. A contact hole 40, which exposes a predetermined region of the substrate 32, is formed in the interlayer insulation layer 38. The drain is exposed through the contact hole 40.

A conductive layer 42, which fills the contact hole 40, is formed on the interlayer insulation layer 38. The conductive layer 42 has a flat surface. Although it is preferable that the conductive layer 42 is formed of a conductive polysilicon layer, it may be formed of a tungsten layer. An oxidation preventing layer 44 is formed on the conductive layer 42. The oxidation preventing layer 44 prevents the conductive layer 42 from being oxidized during subsequent heat treatment of a ferroelectric layer at a high temperature of 600-800° C. The oxidation preventing layer 44 is preferably formed of a cobalt-silicide ($CoSi_2$) layer, but may be formed of a TiN layer, a TiAlN layer, or a TiSiN layer.

A lower electrode 46, a ferroelectric layer 48, and an upper electrode 50, which form a ferroelectric capacitor, are sequentially formed on the oxidation preventing layer 44.

Preferably, the lower electrode 46 is formed of an Ir layer, an $IrO_2$/Ir layer, or a Pt/$IrO_2$/Ir layer. Preferably, the ferroelectric layer 48 is formed of a PZT ($PbZr_xTi_{1-x}O_3$) layer, a SBT ($SrBi_2Ta_2O_9$) layer, or an LBT ($La_xBi_{4-x}Ti_3O_{12}$) layer. Preferably, the upper electrode 50 is formed of the same material layer as the lower electrode 46, but it may be formed of a different material layer having conductivity.

A method of manufacturing the ferroelectric capacitor of the semiconductor device described above will now be described.

Figure 7:
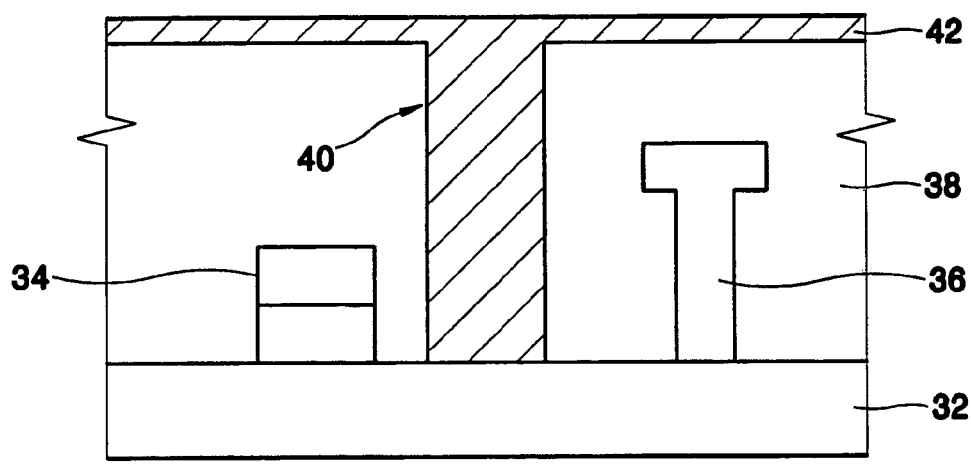
FIGS. 7 through 9 illustrate sectional views for explaining stages in a method of manufacturing the ferroelectric capacitor of a semiconductor device shown in FIG. 6, according to an embodiment of the present invention.

Referring to FIG. 7, a gate 34 and a bit line 36 are formed on a substrate 32. Although not shown, source and drain regions doped with conductive impurities are formed at both sides of the gate 34. An interlayer insulation layer 38 is formed on the substrate 32 such that the gate 34 and the bit line 36 are covered by the interlayer insulation layer 38. A contact hole 40 is formed in the interlayer insulation layer 38 to expose a portion of the substrate 32, i.e., the drain region of a transistor. Thereafter, a conductive layer 42 is formed on the interlayer insulation layer 38 to fill the contact hole 40. The conductive layer 42 is preferably formed of a conductive polysilicon layer, which may be doped, but may be formed of a tungsten layer.

Figure 8:
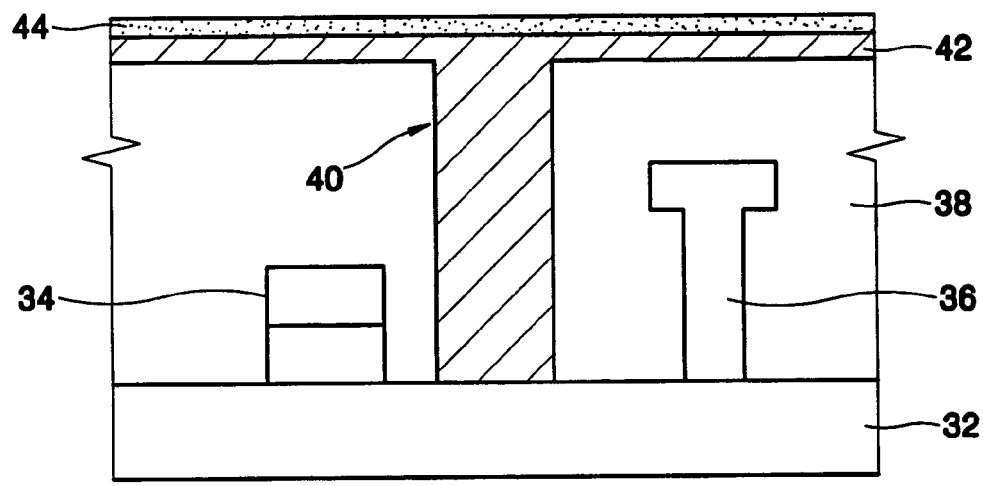

Referring to FIG. 8, an oxidation preventing layer 44 is formed on the conductive polysilicon layer 42. The oxidation preventing layer 44 prevents the conductive polysilicon layer 42 from being oxidized during subsequent heat treatment of a ferroelectric layer at a high temperature of 600-800° C. The oxidation preventing layer 44 is preferably formed of a cobalt-silicide ($CoSi_2$) layer but may be formed of a TiN layer, a TiAlN layer, or a TiSiN layer.

Figure 9:
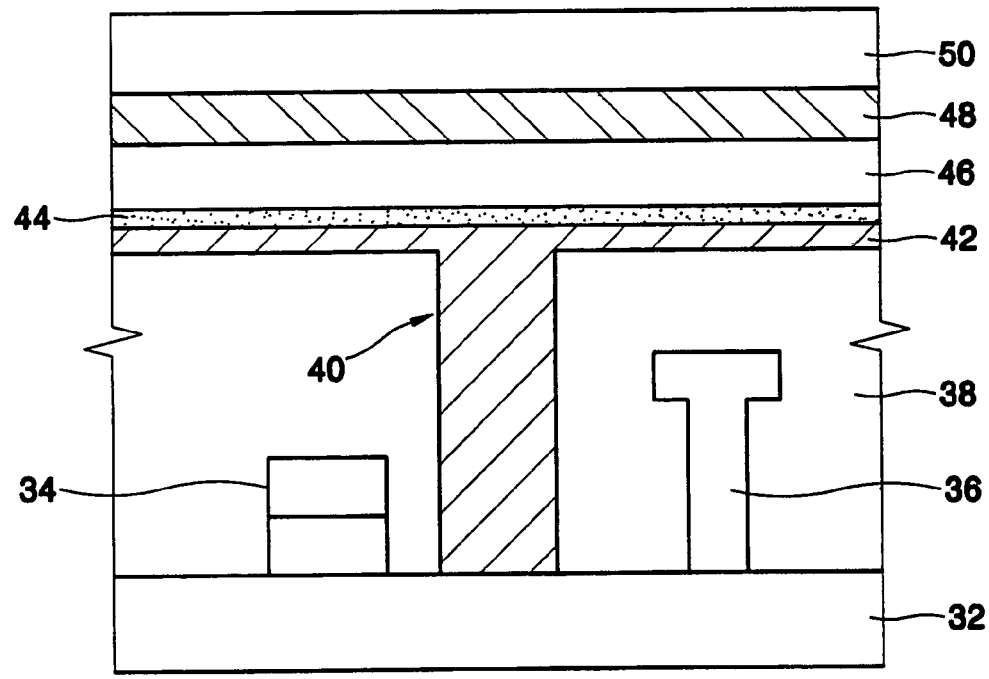

Subsequently, as show in FIG. 9, a lower electrode 46, a ferroelectric layer 48, and an upper electrode 50 are sequentially formed on the oxidation preventing layer 44, thereby forming a ferroelectric capacitor. Here, the lower electrode 46 may be formed of an Ir layer, an $IrO_2$/Ir layer, or a Pt/$IrO_2$/Ir layer, and the ferroelectric layer 48 may be formed of a PZT ($PbZr_xTi_{1-x}O_3$) layer, a SBT ($SrBi_2Ta_2O_9$) layer, or an LBT ($La_xBi_{4-x}Ti_3O_{12}$) layer.

EXPERIMENT EXAMPLE

In an experimental example, a PZT layer as the ferroelectric layer 48 was formed on the lower electrode 46. Here, heat treatment was performed in an oxygen atmosphere for 10 minutes at 700° C. During the heat treatment, the conductive layer 42 was prevented from being oxidized due to the oxidation preventing layer 44. Accordingly, a bad contact between the lower electrode 46 and the conductive layer 42 did not occur.

Figure 10:
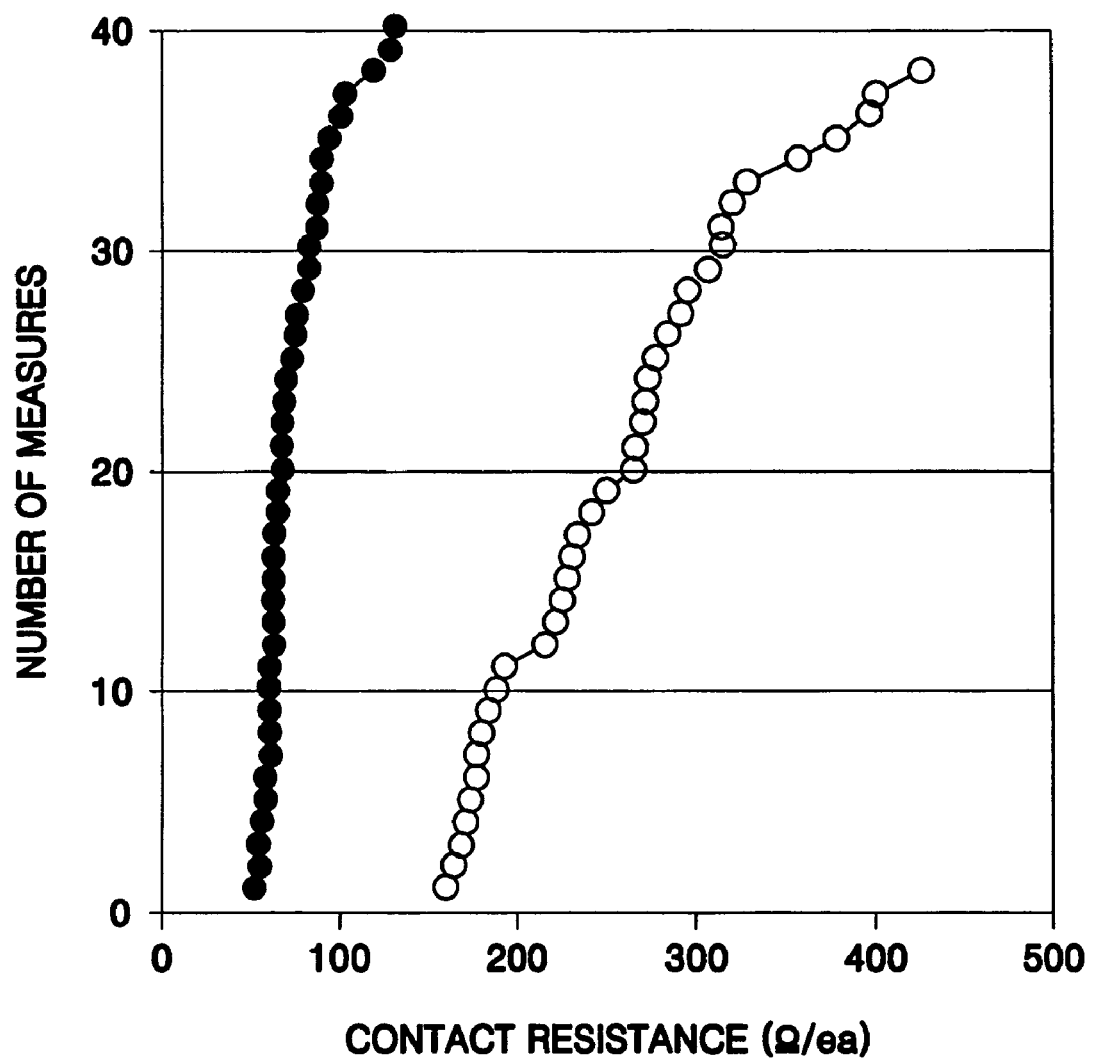
FIG. 10 is a graph of electric resistance values measured with respect to a ferroelectric capacitor manufactured by the conventional method and a ferroelectric capacitor manufactured by the method according to the embodiment of the present invention.

FIG. 10 shows the results of measuring electric resistance values with respect to a ferroelectric capacitor manufactured by the conventional method and a ferroelectric capacitor manufactured by the method according to an embodiment of the present invention. Here, the two ferroelectric capacities follow a design rule of 0.6 μm and have an integrity of 4M-bit. In FIG. 9, "○" indicates the ferroelectric capacitor manufactured by the conventional method, and "●" indicates the ferroelectric capacitor manufactured by the method according to an embodiment of the present invention.

Referring to FIG. 10, in the case of the ferroelectric capacitor manufactured by the conventional method, contact resistance is about 260 Ω on the average and is in the wide range of 150-450 Ω. In the case of the ferroelectric capacitor manufactured by the method according to an embodiment of the present invention, contact resistance is about 75 Ω on the average and is in the narrow range of 50-140 Ω.

In the case of the conventional method, contact resistance due to oxidation of a bonding film (e.g., a Ti film) increases, so electrical isolation occurs during heat treatment of a ferroelectric layer, as described above. However, in the case of the present invention, not only is a conventional bonding film is not used, but also an additional oxidation preventing layer for preventing a conductive layer from being oxidized is formed so that an oxide layer is not formed during heat treatment, which improves the thin film characteristic of a ferroelectric layer. As a result, as described above, contact resistance is low, and electrical isolation does not occur.

In the conventional method, it is difficult to perform heat treatment on a ferroelectric layer at high temperature because of oxidation of a bonding film. In the present invention, however, high-temperature heat treatment is possible to improve the thin film characteristic of a ferroelectric layer.

As described above, in a method of manufacturing a ferroelectric capacitor according to the present invention, the additional oxidation preventing layer 44 is formed between the conductive layer 42, used as a storage node, and the lower electrode 46, so the oxidation resistivity between the conductive layer 42 and the lower electrode 46 increases. As a result, a temperature at which a ferroelectric layer is formed can be increased so that a ferroelectric thin layer having excellent characteristics may be formed. Accordingly, a ferroelectric capacitor having excellent characteristics may be formed.

While the present invention has been particularly shown and described with reference to a preferred embodiment thereof, the preferred embodiment is used in the descriptive sense only. For example, those skilled in the art can apply the technical spirit of the present invention to a case where lower and upper electrodes are formed in a three-dimensional shape, for example, a cylindrical shape, or a case where hemispherical grains are formed on the surface of a lower electrode. Accordingly, it will be understood by those of ordinary skill in the art that various changes in form and details may be made without departing from the spirit and scope of the present invention as set forth in the following claims.

What is claimed is:

1. A method of manufacturing a ferroelectric capacitor, comprising:
    forming an interlayer insulation layer on a substrate having a transistor and a bit line so that the transistor and the bit line are covered by the interlayer insulation layer;
    forming a contact hole in the interlayer insulation layer to partially expose the substrate;
    forming a conductive layer having a set thickness on the interlayer insulation layer, the conductive layer filling the contact hole;
    depositing an oxidation preventing layer on the conductive layer filling the contact hole and formed on the interlayer insulation layer, the oxidation preventing layer being formed to extend across the conductive layer beyond the contact hole such that at least a portion of the conductive layer on the interlayer insulation layer;
    depositing a lower electrode on an entire upper surface of the oxidation preventing layer, after depositing the oxidation preventing layer on the conductive layer;
    depositing a ferroelectric layer on the lower electrode, after depositing the lower electrode on the entire upper surface of the oxidation preventing layer;
    depositing an upper electrode on the ferroelectric layer; and
    heat treating the ferroelectric layer, after depositing the ferroelectric layer, wherein:
    the oxidation preventing layer is electrically conductive, the oxidation preventing layer includes a TiSiN layer, and the depositing of the oxidation preventing layer, the depositing of the lower electrode and the depositing of the ferroelectric layer are sequentially and consecutively performed.

2. The method as claimed in claim 1, wherein the conductive layer includes a tungsten layer.

3. The method as claimed in claim 1, wherein the lower electrode is one selected from the group consisting of an Ir layer, an $IrO_2/Ir$ layer, and a $Pt/IrO_2/Ir$ layer.

4. The method as claimed in claim 3, wherein the lower electrode and the upper electrode are made of a same material.

5. The method as claimed in claim 1, wherein the ferroelectric layer is one selected from the group consisting of a PZT ($PbZr_xTi_1$-$xO_3$) layer, a SBT ($SrBi_2Ta_2O_9$) layer, and an LBT ($La_xBi_4$-$xTi_3O_{12}$) layer.

6. The method as claimed in claim 1, wherein forming the conductive layer comprises extending the conductive layer over the interlayer insulation layer.

7. The method as claimed in claim 1, wherein the contact hole is formed to have a first width in a first direction, and
    the conductive layer is formed to have a second width in the first direction, the second width being greater than the first width.

8. The method as claimed in claim 7, wherein the oxidation preventing layer is formed to have a third width in the first direction, the third width being greater than the first width.

9. The method as claimed in claim 8, wherein the third width is about equal to the second width.

10. The method as claimed in claim 1, wherein the lower electrode is formed to extend beyond the contact hole across the oxidation preventing layer such that the lower electrode, the oxidation preventing layer and the conductive layer are sequentially stacked on the interlayer insulation layer adjacent to the contact hole.

11. The method as claimed in claim 1, wherein a contact resistance between the lower electrode and the conductive layer is about 50 ohms to 140 ohms.

12. A method of manufacturing a ferroelectric capacitor, comprising:
    forming an interlayer insulation layer on a substrate having a transistor and a bit line so that the transistor and the bit line are covered by the interlayer insulation layer;
    forming a contact hole in the interlayer insulation layer to partially expose the substrate;
    forming a conductive layer having a set thickness on the interlayer insulation layer, the conductive layer filling the contact hole;
    depositing an oxidation preventing layer on the conductive layer, the oxidation preventing layer being formed to extend across the conductive layer beyond the contact hole such that at least a portion of the conductive layer on the interlayer insulation layer is disposed between the oxidation preventing layer and the interlayer insulation layer;
    depositing a lower electrode on an entire upper surface of the oxidation preventing layer, after depositing the oxidation preventing layer on the conductive layer;
    depositing a ferroelectric layer on the lower electrode, after depositing the lower electrode on the entire upper surface of the oxidation preventing layer;
    depositing an upper electrode on the ferroelectric layer; and
    heat treating the ferroelectric layer, after depositing the ferroelectric layer, wherein:
    the oxidation preventing layer is electrically conductive, the conductive layer includes a conductive polysilicon layer, the oxidation preventing layer includes a $CoSi_2$ layer, and the depositing of the oxidation preventing layer, the depositing of the lower electrode and the depositing of the ferroelectric layer are sequentially and consecutively performed.

13. The method as claimed in claim 12, wherein forming the conductive layer comprises extending the conductive layer over the interlayer insulation layer.

* * * * *